Figure 1:
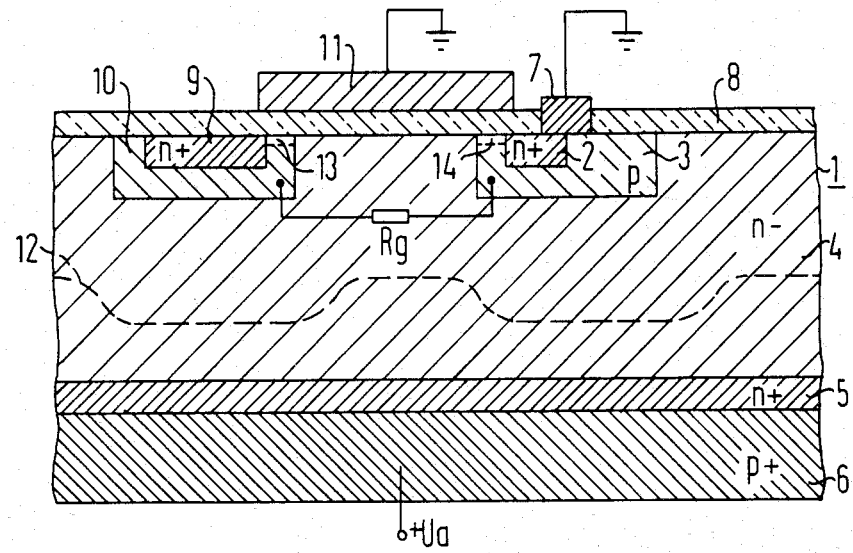

United States Patent [19]

Leipold et al.

[11] Patent Number: 4,502,070

[45] Date of Patent: Feb. 26, 1985

[54] FET CONTROLLED THYRISTOR

[75] Inventors: Ludwig Leipold; Jens P. Stengl; Jenö Tihanyi, all of Munich, Fed. Rep. of Germany

[73] Assignee: Siemens Aktiengesellschaft, Berlin and Munich, Fed. Rep. of Germany

[21] Appl. No.: 276,196

[22] Filed: Jun. 22, 1981

[30] Foreign Application Priority Data

Jun. 26, 1980 [DE] Fed. Rep. of Germany ....... 3024015

[51] Int. Cl.³ .................... H01L 29/74; H01L 27/02; H01L 29/78
[52] U.S. Cl. ...................................... 357/38; 357/43; 357/23.4
[58] Field of Search ................... 357/38, 39, 43, 23 R, 357/23 C, 23 VD; 307/252 T, 252 B, 305, 311

[56] References Cited

U.S. PATENT DOCUMENTS 3,697,830  10/1972  Dale .............................. 317/235 R
4,223,328   9/1980  Terasawa et al. ................ 357/22
4,364,073  12/1982  Becke et al. ..................... 357/23

FOREIGN PATENT DOCUMENTS 2904424  8/1980  Fed. Rep. of Germany .... 357/38 T
0146229  1/1981  German Democratic Rep. ... 357/38 L Primary Examiner—Andrew J. James
Assistant Examiner—John Lamont
Attorney, Agent, or Firm—Herbert L. Lerner; Laurence A. Greenberg

[57] ABSTRACT

Controlled semiconductor switch with a semiconductor body containing a thyristor structure having a first zone of first conductivity type embedded in coplanar relationship in a second zone of second conductivity type; also containing a third zone of the first conductivity type and a fourth zone of the second conductivity type; and further containing an MIS-FET integrated into the semiconductor body and having a source zone of the first conductivity type embedded in coplanar relationship in a zone of the second conductivity type; an insulating layer disposed on the surface of the semiconductor body, a control electrode lying on the insulating layer and covering a first channel zone operatively associated with the FET; and a cathode electrode on the semiconductor body, including the features that the zone of the second conductivity type of the MIS-FET is embedded in the third zone in coplanar relationship therewith and forms the first channel zone at the surface of the semiconductor body; the second zone of the thyristor structure is embedded in the third zone in coplanar relationship therewith and forms a second channel zone at the surface of the semiconductor body; the third zone extends to the surface of the semiconductor body between the two channel zones; the control electrode also covers the second channel zone and the part of the third zone extending to the surface of the semiconductor body; and the cathode electrode is in contact with the source zone of the MIS-FET.

6 Claims, 3 Drawing Figures

FET CONTROLLED THYRISTOR

The present invention relates to a controlled semiconductor switch and, more particularly, to such a switch with a semiconductor body containing a thyristor structure having a first zone of first conductivity or conductance embedded in planar fashion or coplanar relationship in a second zone of second conductivity type, also containing a third zone of the first conductivity type and a fourth zone of the second conductivity type, further containing an MIS-FET integrated into the semiconductor body and having a source zone of the first conductivity type embedded in coplanar relationship in a zone of the second conductivity type; an insulating layer lying on the surface of the semiconductor body; a control electrode disposed on the insulating layer and covering a first channel zone associated with the FET; and a cathode electrode on the semiconductor body.

Such a semiconductor switch has been described heretofore, for example, in German Published Non-Prosecuted application (DE-OS) No. 26 25 917. This semiconductor switch is a thyristor which is able to be switched off i.e. is disconnectible, and has a semiconductor body into which a field effect transistor (FET) is integrated. A control electrode insulated from the surface of the semiconductor body is provided for driving the FET. To switch off or disconnect the switched-on thyristor, the FET is switched into conduction and forms a short circuit between the emitter zone on the cathode side and the base zone on the cathode side. Then, the thyristor current flows off into the short circuits, partially bypassing the emitter zone on the cathode side. The charge-carrier emission from the cathode zone is thereby reduced. In order to switch the thyristor off, a given portion of the active thyristor surface area must be short-circuited. The current-carrying capacity of the thyristor is reduced by this amount. To switch on, the thyristor has another control electrode by which control current can be injected into the semiconductor body in a conventional manner. This control current is generally between 10 and 100 mA. Direct drive by microprocessors or LSI circuits is therefore out of the question. Among the semiconductor switches which can be driven by microprocessors are the power MIS-FETs which have recently become known. However, such MIS-FETs have a relatively high insertion resistance, which is all the higher, the greater the voltage to be switched. In the case of an MIS-FET for 500 V, for example, this insertion resistance is between 1 and 5 ohms. With a large current, a quite considerable dissipation loss is converted in the transistor, which must be removed by cooling.

It is accordingly an object of the invention to provide a disconnectible semiconductor switch i.e. one which can be switched off, of the type mentioned in the introduction hereto, which can be driven practically without power and, in addition, has a very low insertion resistance.

With the foregoing and other objects in view, there is provided, in accordance with the invention, a controlled semiconductor switch with a semiconductor body containing a thyristor structure having a first zone of first conductivity type embedded in coplanar relationship in a second zone of second conductivity type; also containing a third zone of the first conductivity type and a fourth zone of the second conductivity type; and further containing an MIS-FET integrated into the semiconductor body and having a source zone of the first conductivity type embedded in coplanar relationship in a zone of the second conductivity type; an insulating layer disposed on the surface of the semiconductor body; a control electrode lying on the insulating layer and covering a first channel zone operatively associated with the FET; and a cathode electrode on the semiconductor body, comprising the features that: the zone of the second conductivity type of the MIS-FET is embedded in the third zone in coplanar relationship therewith and forms the first channel zone at the surface of the semiconductor body; the second zone of the thyristor structure is embedded in the third zone in coplanar relationship therewith and forms a second channel zone at the surface of the semiconductor body; the third zone extends to the surface of the semiconductor body between the two channel zones; the control electrode also covers the second channel zone and the part of the third zone extending to the surface of the semiconductor body; and the cathode electrode is in contact with the source zone of the MIS-FET.

In accordance with another feature of the invention, the cathode electrode is also in contact with the zone of the second conductivity type of the FET.

In accordance with a further feature of the invention, the fourth zone is disposed at a side of the semiconductor body facing away from the cathode electrode.

In accordance with an additional feature of the invention, the third zone has a heavily doped region of the first conductivity type which is adjacent to the fourth zone.

In accordance with an added feature of the invention, the fourth zone is embedded in the semiconductor body at that side thereof which carries the cathode electrode.

In accordance with a concomitant feature of the invention, the fourth zone is surrounded by a heavily doped region of the first conductivity type which is embedded in the third zone.

Other features which are considered as characteristic for the invention are set forth in the appended claims.

Although the invention is illustrated and described herein as embodied in a controlled semiconductor switch, it is nevertheless not intended to be limited to the details shown, since various modifications and structural changes may be made therein without departing from the spirit of the invention and within the scope and range of equivalents of the claims.

Figure 2:
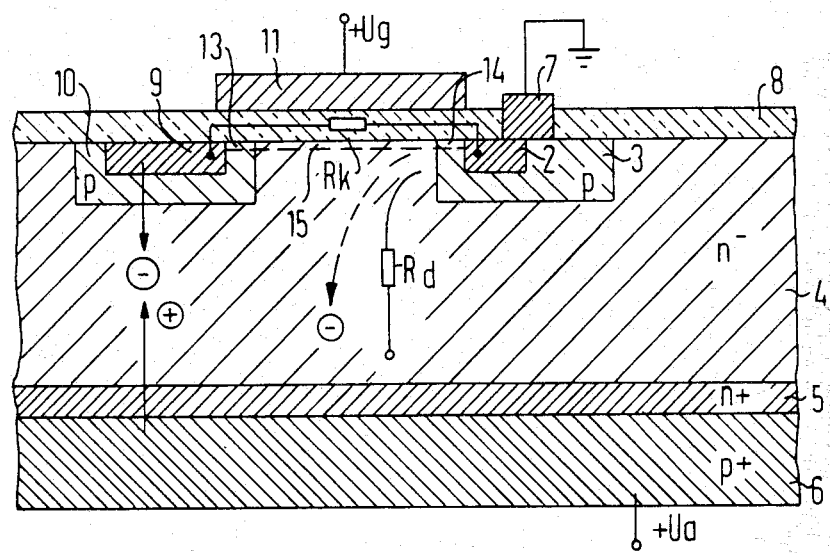
Figure 3:
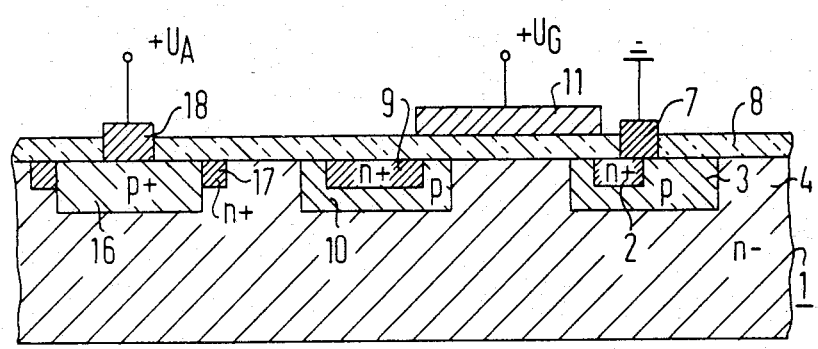

The construction and method of operation of the invention, however, together with additional objects and advantages thereof will be best understood from the following description of specific embodiments when read in connection with the accompanying drawings, in which:

FIGS. 1 and 2 are similar cross-sectional views of a semiconductor body of a first semiconductor switch in two different operating states thereof; and FIG. 3 is a cross-sectional view of a semiconductor body of a second semiconductor switch according to the invention.

Referring now to the drawing and first, particularly, to FIG. 1 thereof, there is shown a semiconductor switch having a semiconductor body 1 which includes a thyristor structure and an FET. The FET has a source zone 2 of given conductivity type, which is embedded in surface coplanar relationship or planar manner in a zone 3 of opposite conductivity type. The zone 3, in turn, is embedded in coplanar relationship in a third zone 4 of the semiconductor body 1. The zone 3 therefore extends up to the surface of the semiconductor body and is provided to form a conducting layer of the FET and to form a first channel zone 14. The third zone 4 serves as the drain zone for the FET. In the illustrated embodiment, zone 2 is heavily n-doped.

The thyristor structure is made up of a first zone 9 which is embedded in coplanar relationship in a second zone 10. The second zone 10 is, in turn, embedded in coplanar manner in the third zone 4 which belongs in common to the thyristor structure and to the FET. The fourth zone of the thyristor structure is the zone 6. The first zone 9 is the emitter zone on the cathode side, the zone 10 is the base zone on the cathode side, the zone 4 is the base zone on the anode side and the zone 6 is the emitter zone on the anode side. The doping of the just-mentioned zones is $n^+$, p, $n^-$, and $p^+$, respectively, in the illustrated embodiment. Between the zones 4 and 6, a further heavily n-doped zone 5 can be provided, the function of which is explained hereinbelow. The zone 10 extends to the surface of the semiconductor body and serves for forming a second channel zone 13.

The surface of the semiconductor body is provided with an insulating layer 8, for example of $SiO_2$, on which a control electrode 11 is disposed. The control electrode 11 covers the channel zones 14 and 13 of the zones 3 and 10, respectively, and the portion of the zone 4 which extends to the surface of the semiconductor body between the channel zones 13 and 14. The source zone 2 is contacted by an electrode 7 which assumes the function of a cathode electrode. It can simultaneously also contact the zone 3 of the FET. Between the zones 3 and 10, there is further diagrammatically illustrated a resistor $R_g$, through which a fixed potential is applied to the zone 10. This resistor $R_g$ can either be realized externally or internally by a strip of the same conductivity type connecting the zones 10 and 3.

In FIG. 1, the control electrode 11 is at the same potential as the cathode electrode 7. For the indicated polarity of the anode voltage $U_a$, the switch is biased in blocking direction (forward direction) and the pn-junction between the zones 3 and 4 is blocked or cut off. Then, a space charge zone is formed, the boundary of which is represented by a broken line 12. If a positive voltage $+U_g$ is applied to the electrode 11 (FIG. 2), inversion layers which represent the n-conductivity channels between the zones 2 and 4, on the one hand, and the zones 4 and 9, on the other hand, are formed in the channel zones 13 and 14. Between the channel zones 13 and 14, an enhancement layer 15 of negative charge carriers is formed under the control electrode in the zone 4, so that a well-conductive, purely ohmic connection is created between the zones 2 and 9. The zone 9 is then practically at cathode potential. Thus, emission of negative charge carriers from the zone 9 into the zone 4 can begin, which causes emission of positive charge carriers from the zone 6. This process is fanned up until the pn-junction between the zones 10 and 4 is poled in the forward direction and the thyristor structure is fired. Simultaneously, a given amount of flow of negative charge carriers will occur, of course, from the zone 2 in direction toward the anode as indicated by the curved arrow shown with a broken line. The resistance which the electrons encounter there is symbolized by the resistor $R_d$. It is considerably higher than that resistance which is encountered by those charge carriers which travel through the layer 15 via the thyristor structure. The resistance in the channel 15 is symbolized by the resistor $R_k$.

Should the switch be opened, the control voltage is removed. The layer 15 is then dissolved and the inversion layers in the channel zones 13 and 14 disappear. The flow of current to the thyristor structure is thereby interrupted and the thyristor structure changes to the blocked state. The positive and negative charge carriers stored in the semiconductor body then disappear by recombination. The recombination rate can be increased by incorporating the heavily n-doped zone 5 between the zones 4 and 6. Doping of the zones 5 and 6 can be equally heavy. If a longer decay time of the current can be tolerated, the zone 5 can be dispensed with, which affords the advantage, simultaneously, that the semiconductor switch can block higher voltages also in reverse direction.

In FIG. 3, a disconnectible semiconductor switch is shown which differs from the switch illustrated in FIGS. 1 and 2 by the lateral construction thereof. Like parts or parts having the same function as those in FIGS. 1 and 2 are identified by the same reference characters in FIG. 3. In the embodiment of FIG. 3, the emitter zone 16 on the anode side (i.e. the fourth zone) of the thyristor structure lies at that surface of the semiconductor body 1 which carries the cathode contact 7. The emitter zone 16 is advantageously disposed on the side of the zones 9 and 10 which faces away from the FET 2, 3, 4. The zone 16, like the other zones 2 and 10, is embedded in the surface of the semiconductor body 1 in coplanar fashion. The zone 16 carries an anode contact 18 and may be surrounded by a heavily doped zone 17 having the same function as that of the zone 5 according to FIGS. 1 and 2.

It has been found that the insertion resistance of an embodiment of the hereinafore described semiconductor switch which was constructed, for example, for 500 V and 10 A, was only a few tenths of an ohm. Thus, the insertion resistance of the semiconductor switch according to the invention is lower by about one order of magnitude than that of a field effect transistor.

There are claimed:

1. Controlled semiconductor switch with a semiconductor body containing a thyristor structure having a first zone of first conductivity type, free of external connection, embedded in coplanar relationship in a second zone of second conductivity type, free of external connection;

also containing a third zone of the first conductivity type and a fourth zone of the second conductivity type; and further containing an MIS-FET integrated into the semiconductor body and having a source zone of the first conductivity type embedded in coplanar relationship in a zone of the second conductivity type;

an insulating layer disposed on the surface of the semiconductor body, a control electrode lying on the insulating layer and covering a first channel zone operatively associated with the FET; and a cathode electrode on the semiconductor body, comprising the features that:

(a) the zone of the second conductivity type of the MIS-FET constitutes a fifth zone of the semiconductor body and is embedded in the third zone in coplanar relationship therewith and forms the first channel zone at the surface of the semiconductor body;

(b) the source zone of the first conductivity type of the MIS-FET constitutes a sixth zone of the semiconductor body and is embedded in said fifth zone in coplanar relationship therewith;

(c) the second zone of the thyristor structure is embedded in the third zone in coplanar relationship therewith and forms a second channel zone at the surface of the semiconductor body;

(d) the third zone extends to the surface of the semiconductor body between the two channel zones;

(e) the control electrode also covers said second channel zone and the part of the third zone extending to the surface of the semiconductor body; and (f) the cathode electrode is in contact with the source zone of the MIS-FET.

2. Semiconductor switch according to claim 1, wherein the cathode electrode is also in contact with the zone of the second conductivity type of the FET constituting the sixth zone of the semiconductor body.

3. Semiconductor switch according to claim 1 wherein the fourth zone is disposed at a side of the semiconductor body facing away from the cathode electrode.

4. Semiconductor switch according to claim 3 including a heavily doped region of the first conductivity type located between and adjacent to the third zone and the fourth zone.

5. Semiconductor switch according to claim 1 wherein the fourth zone is embedded in the semiconductor body at that side thereof which carries the cathode electrode.

6. Semiconductor switch according to claim 5 wherein the fourth zone is surrounded by a heavily doped region of the first conductivity type which is embedded in the third zone.

* * * * *